(12) United States Patent
Deng et al.

(10) Patent No.: US 7,635,616 B2
(45) Date of Patent: Dec. 22, 2009

(54) TFT LCD ARRAY SUBSTRATE AND MANUFACTURING METHOD THEREOF

(75) Inventors: Chaoyong Deng, Beijing (CN); Seung Moo Rim, Beijing (CN)

(73) Assignee: BOE Optoelectronics Technology Co., Ltd., Beijing (CN)

( * ) Notice: Subject to any disclaimer, the term of this patent is extended or adjusted under 35 U.S.C. 154(b) by 149 days.

(21) Appl. No.: 11/752,475

(22) Filed: May 23, 2007

(65) Prior Publication Data

US 2007/0272926 A1    Nov. 29, 2007

(30) Foreign Application Priority Data

May 23, 2006    (CN)    ......................... 2006 1 0080640

(51) Int. Cl.
*H01L 21/00*    (2006.01)
*H01L 21/302*    (2006.01)
*H01L 21/461*    (2006.01)

(52) U.S. Cl. ................ 438/149; 438/736; 257/E21.023

(58) Field of Classification Search .................... 438/30, 438/736, 942, 945, FOR. 473; 257/E21.023, 257/E21.039

See application file for complete search history.

(56) References Cited

U.S. PATENT DOCUMENTS

| | | | | |
|---|---|---|---|---|
| 5,976,734 | A * | 11/1999 | Yamaguchi | ..................... 430/7 |
| 6,531,392 | B2 | 3/2003 | Song et al. | |
| 6,649,934 | B2 | 11/2003 | Song et al. | |
| 7,056,777 | B2 | 6/2006 | Kim et al. | |
| 2004/0063254 | A1 * | 4/2004 | Wang et al. | .................. 438/149 |
| 2004/0125313 | A1 * | 7/2004 | Lim | ........................... 349/152 |
| 2006/0228839 | A1 * | 10/2006 | Liao | ........................... 438/151 |

(Continued)

FOREIGN PATENT DOCUMENTS

JP    06-314789    11/1994

OTHER PUBLICATIONS

U.S. Appl. No. 11/958,613, filed Dec. 18, 2007, Zhangtao Wang.

(Continued)

*Primary Examiner*—Savitri Mulpuri
*Assistant Examiner*—Calvin Choi
(74) *Attorney, Agent, or Firm*—Daniel F. Nesbitt; Hasse & Nesbitt LLC (57) ABSTRACT

A TFT LCD array substrate and a manufacturing method thereof. The TFT LCD array substrate includes a substrate and a pixel array on the substrate. Each pixel has: a gate line and a gate electrode formed on the substrate; a gate insulating layer formed on the gate line and the gate electrode; a semiconductor layer formed on the gate insulating layer disposed on the gate electrode; an ohmic contact layer having two parts, which are disposed on two sides of the semiconductor layer respectively and are apart from one another; an isolation insulating dielectric layer covering the substrate and the gate insulating layer except a portion on which the semiconductor layer is formed; a pixel electrode formed on the isolation insulating dielectric layer and the ohmic contact layer over the semiconductor layer; a source/drain electrode formed on the pixel electrode over the ohmic contact layer, and a passivation layer at least covering the semiconductor layer. The TFT LCD array substrate can be manufactured with a 3Mask technology, thereby the process steps are reduced and the utilization ratio of the equipment is improved.

12 Claims, 6 Drawing Sheets

U.S. PATENT DOCUMENTS

| | | |
|---|---|---|
| 2007/0246707 A1 | 10/2007 | Deng |
| 2007/0298554 A1 | 12/2007 | Long |
| 2008/0030639 A1 | 2/2008 | Qiu |
| 2008/0061295 A1 | 3/2008 | Wang |
| 2008/0100766 A1 | 5/2008 | Ming |
| 2008/0105873 A1 | 5/2008 | Wang |
| 2008/0105874 A1 | 5/2008 | Wang |
| 2008/0111136 A1 | 5/2008 | Qiu |
| 2008/0111934 A1 | 5/2008 | Wu |
| 2008/0117347 A1 | 5/2008 | Zhang |
| 2008/0123007 A1 | 5/2008 | Cui |
| 2008/0123030 A1 | 5/2008 | Song |
| 2008/0142802 A1 | 6/2008 | Qiu |
| 2008/0142819 A1 | 6/2008 | Liu |

OTHER PUBLICATIONS

U.S. Appl. No. 11/958,634, filed Dec. 18, 2007, Chungping Long.

U.S. Appl. No. 12/104,575, filed Apr. 17, 2008, Xinxin Li.

\* cited by examiner

(prior art)

TFT LCD ARRAY SUBSTRATE AND MANUFACTURING METHOD THEREOF

FIELD OF THE INVENTION

The present invention relates to a thin film transistor liquid crystal display (TFT LCD) array substrate and a manufacturing method thereof, and more particularly, to a TFT LCD array substrate manufactured with three photolithography processes and a manufacturing method thereof.

BACKGROUND OF THE INVENTION

As one important type of flat plate display, a LCD, such as TFT LCD, has been developing rapidly in the last decade and has attracted much attention. Due to the severe competition among the manufactures and advancement in manufacturing technology of TFT LCD, LCDs with excellent display performance and lower price have been increasingly put into the market. Therefore, introduction of more advanced manufacturing technology to further simplify the production process and reduce the production cost has become more important to enable the manufacturer to survive in the severe competition.

The manufacturing technology for TFT LCD array substrate has undergone the map from the seven mask (7Mask, one cycle of photolithography is processed with one mask) technology to the current five mask (5Mask) technology, and the 5Mask technology today has become the mainstream for manufacturing TFT LCD array substrate.

Some manufacturers have attempted to exploit the four mask (4Mask) technology in fabrication. This 4Mask technology is based on the previous 5Mask technology, in which the mask for forming active layer (Active Mask) and the mask for forming source/drain electrode (S/D Mask) are merged into a single one with the aid of a gray tone mask, and the function of the original two masks, i.e., Active Mask and S/D Mask, is achieved by the single mask through the modification to the etching processes.

A gray tone mask has a slit-shaped pattern thereon, and besides the fully transparent and opaque regions, partially transparent patterned regions are formed due to the interference and diffraction of the light passing the patterned regions of the mask. During exposure, the light only partially passes through the partially transparent portions. By controlling the exposure quantity, the light passing through the partially transparent portions illuminates portions of photoresist and has the portions partially exposed, and the light passing through the fully transparent portions of the mask illuminates the other portions of the photoresist and has these portions fully exposed. After development, no photoresist exists in the fully exposed regions, and photoresist thickness in the partially exposed regions is less than that in the non-exposed regions, so that the exposed photoresist is shaped in three-dimension. The photoresist thickness after development can be controlled by controlling the transmittance ratio among the respective regions of the gray tone mask, i.e. the "duty ratio" of the slit region to the empty region. The method of forming a three-dimensional pattern with different thickness in the photoresist through a mask with partially transparent patterned region can be collectively called gray tone mask technology.

Figure 1:
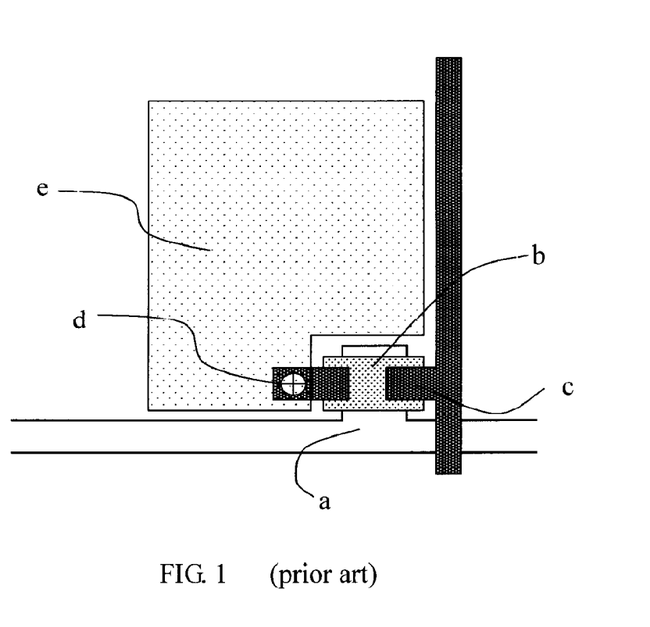
FIG. 1 is a plan view of a typical pixel unit of a TFT LCD array substrate formed by the conventional 5Mask process.
Figure 2:
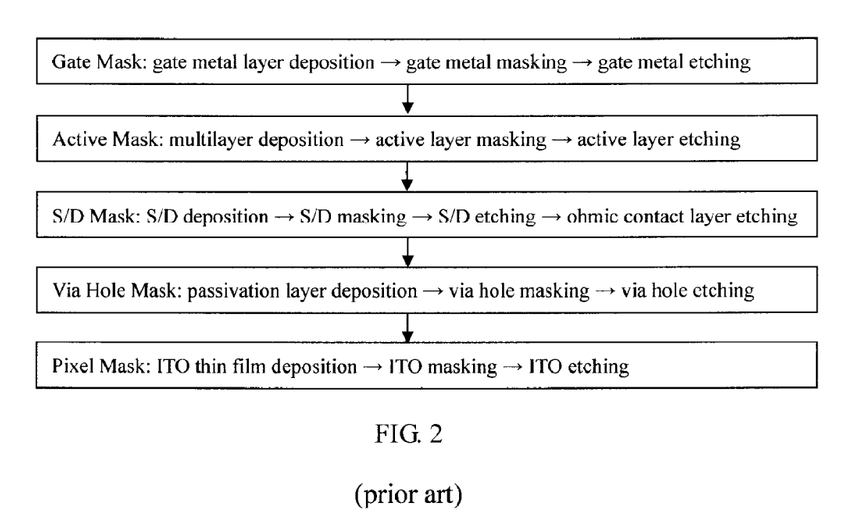
FIG. 2 is the conventional 5Mask process's flowchart.

Referring to FIGS. 1 and 2, the conventional 5Mask technology uses five masks for photolithography, including the masks for forming a gate electrode a (Gate Mask), an active layer b (Active Mask), a source/drain electrode c (S/D Mask), a via hole d (Via Hole Mask), and a pixel electrode e (Pixel Mask), respectively. Each process using the respective masks further includes one or more thin film deposition, photolithography with the mask and etching (e.g., dry etching or wet etching) processes, thus resulting in five cycles of thin film deposition, photolithography, and etching processes, as shown in FIG. 2.

A typical pixel unit of the TFT LCD array substrate manufactured by the above conventional 5Mask technology is shown in FIG. 1.

Compared with the existing 7Mask technology, the 5Mask or 4Mask technologies has greatly simplified the manufacturing processes and significantly improved the utilization ratio of the equipment and the production capacity, but such technologies still suffer from the drawbacks such as complicated manufacturing process, low production capacity and low utilization ratio of the equipment.

SUMMARY OF THE INVENTION

In line with the trend of the art, the present invention provides a TFT LCD array substrate and the manufacturing method thereof, which reduces the photolithography using a mask and accordingly reduces the process step, consumed time, and cost, and improves the production capacity, the utilization ratio of the equipment, and the yield.

The present invention provides a TFT LCD array substrate, comprising a substrate and a pixel array on the substrate. Each pixel comprises: a gate line and a gate electrode formed on the substrate; a gate insulating layer formed on the gate line and the gate electrode; a semiconductor layer formed on the gate insulating layer disposed on the gate electrode; an ohmic contact layer having two parts, which are disposed on two sides of the semiconductor layer respectively and are apart from one another; an isolation insulating dielectric layer covering the substrate and the gate insulating layer except a portion on which the semiconductor layer is formed; a pixel electrode formed on the isolation insulating dielectric layer and the ohmic contact layer over the semiconductor layer; a source/drain electrode formed on the pixel electrode over the ohmic contact layer, and a passivation layer at least covering the semiconductor layer.

Herein, the ohmic contact layer can be a μc-Si layer. The data line can be integrated with the source/drain electrode. The gate line and the gate electrode can be a single layer film of AlNd, Al, Cu, Mo, MoW or Cr, or a composite film of any combination of AlNd, Al, Cu, Mo, MoW, Cr. The gate insulating layer and isolation insulating dielectric layer can be a single layer film of SiNx, SiOx, or SiOxNy, or a composite film of any combination of SiNx, SiOx, SiOxNy. The source/drain electrode can be a single layer film of Mo, MoW or Cr, or a composite film of any combination of Mo, MoW, Cr.

The present invention also provides a method of manufacturing a TFT LCD array substrate, comprising following steps:

i) step A of depositing a gate metal layer, a gate insulating dielectric layer, a semiconductor material layer and an ohmic contact material layer in order on a substrate, and patterning thereof using a first gray tone mask and photoresist into gate lines and gate electrodes, gate insulating layers, semiconductor layers and ohmic contact layers, respectively, wherein the photoresist disposed on the ohmic contact layers is not stripped off;

ii) step B of depositing an isolation insulating dielectric layer on the substrate after step A, and then stripping off the photoresist to thereby removing the isolation insulating dielectric layer disposed on the ohmic contact layers;

iii) step C of depositing a pixel electrode layer and a source/drain electrode metal layer on the substrate after step B, and then patterning thereof using a second gray tone mask and photoresist into pixel electrodes, source/drain electrodes and data lines, wherein each of the ohmic contact layer is partially removed to partially expose the semiconductor layers; and iv) step D of depositing a passivation layer on the substrate after step C which at least covers the exposed semiconductor layers.

Herein the ohmic contact layer deposited in step A can be made of a μc-Si layer.

When patterning using the first gray tone mask in step A, the portion of the substrate where the gate lines and gate electrodes will be formed corresponds to the partially transparent portion of the mask, another portion of the substrate where the semiconductor layers and the ohmic contact layers will be formed corresponds to the opaque portion of the mask, and the remaining portion of the substrate corresponds to the completely transparent portion of the mask.

When patterning using the second gray tone mask in step C, the portion of the substrate where the pixel electrodes will be formed corresponds to the partially transparent portion of the mask, another portion of the substrate where the source/drain electrodes and the data lines will be formed corresponds to the opaque portion of the mask, and the remaining portion of the substrate corresponds to the completely transparent portion of the mask. The pixel electrode layer and source/drain electrode metal layer can be deposited successively in a same or different equipment in step C.

Compared with the existing 5Mask technology, the method of manufacturing TFT LCD array substrate utilizing a three-mask (3Mask) technology according to the present invention provides the following advantages:

1. There is provided a novel TFT LCD array substrate and a novel manufacturing method, which are different from those of the existing 5Mask or 4Mask technology;
2. The original 5Mask technology is further simplified to a 3Mask technology and two masking processes are omitted, thereby the process steps and production cost are reduced and the production yield is improved; and
3. The Gate Mask and the Active Mask are merged, thereby the deposition of the gate insulating layer and multilayer thin film of the TFT can be performed directly after the deposition of gate metal layer, and by merging the S/D Mask and the Pixel Mask, the source/drain electrode metal layer and the pixel electrode layer can be deposited successively by sputtering in a same or different equipment.

With the present invention, the process time can be significantly reduced and the production yield can be improved, thereby accomplishing the object of improving production capacity and reducing the production cost.

DESCRIPTION OF THE PREFERRED EMBODIMENTS

The following is provided for convenience in identifying the elements of the drawings.

1: substrate
2: gate line and gate electrode
3: gate insulating layer
4: semiconductor layer
5: ohmic contact layer
6: isolation insulating dielectric layer
7: pixel electrode
8: data line
9: passivation layer
10: photoresist The preferred embodiment according to the invention will be described in detail with reference to the drawings.

Figure 3:
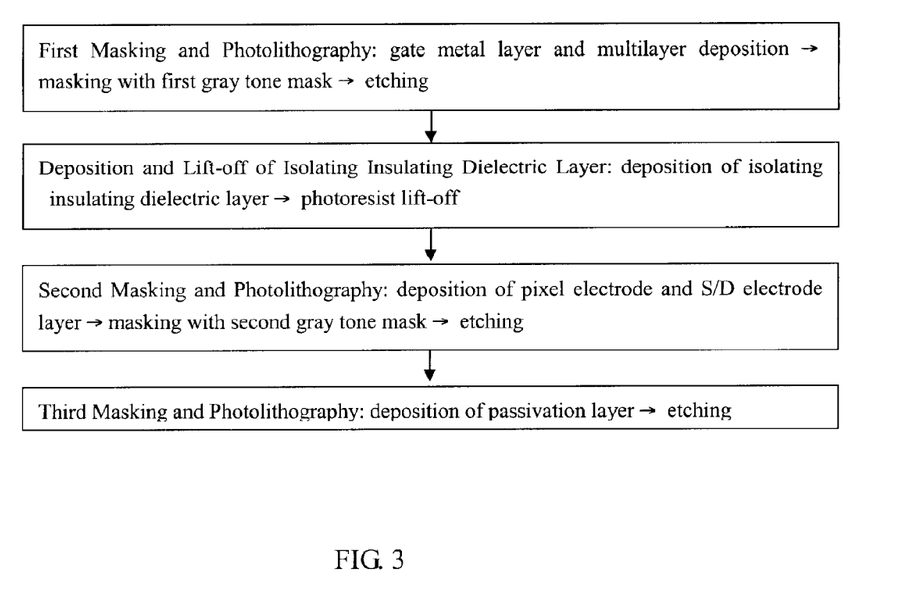
FIG. 3 is the flowchart of the preferred embodiment according to the present invention.

As shown in FIG. 3, a manufacturing process according to the present invention comprises the following steps.

Step A. A gate metal layer is deposited on a substrate for example by sputtering. Then a gate insulating dielectric layer, a semiconductor material layer and an ohmic contact material layer are sequentially deposited for example by chemical vapor deposition (CVD) process. The ohmic contact layer is made of a material which can form an ohmic contact between the semiconductor layer and the pixel electrode that are to be formed later. Then photoresist is applied to the resultant substrate, and masking with a gray tone mask is performed for forming a pattern, in which the portion of the substrate where the gate line and the gate electrode will be formed corresponds to the partially transparent portion of the mask, the portion where the semiconductor layer and the ohmic contact layer of the TFT will be formed corresponds to the opaque portion of the mask, and the remaining portion corresponds to the completely transparent portion of the mask. Then exposure, development and etching are performed to pattern the deposited layers to form the gate line, the gate electrode, the gate insulating layer, the semiconductor layer and an ohmic contact layer of the TFT. The photoresist strip-off is not performed after etching in this step, i.e., the pattern of photoresist formed on the substrate is not stripped off.

The gate metal layer deposited in this step can be a single layer film of AlNd, Al, Cu, Mo, MoW or Cr, and can also be a composite film of any combination of AlNd, Al, Cu, Mo, MoW, Cr. The deposited gate insulating dielectric layer can be a single layer film of $SiN_x$, $SiO_x$, or $SiO_xN_y$, or a composite film of any combination of $SiN_x$, $SiO_x$, $SiO_xN_y$.

Step B. An isolation insulating dielectric layer is deposited for example by CVD process on the substrate after the above step A. Then the photoresist and the isolation insulating dielectric layer deposited on the photoresist are stripped off together by photoresist strip-off process, so as to expose the ohmic contact layer on the TFT, for the ohmic contact between the pixel electrode layer to be formed later and the semiconductor layer (i.e., between the source/drain electrode and the semiconductor layer).

The isolation insulating dielectric layer deposited in this step B can be a single layer film of SiNx, SiOx, or SiOxNy, or a composite film of any combination of SiNx, SiOx, SiOxNy.

Step C. A pixel electrode layer and a source/drain electrode metal layer are deposited for example by sputtering on the substrate after step B. The photoresist is applied to the resultant substrate, and masking with a gray tone mask is performed for forming a pattern, in which the portion of the substrate where the pixel electrode will be formed corresponds to the partially transparent portion of the mask, the portion where the source/drain electrode and the data line will be formed corresponds to the opaque portion of the mask, and the remaining portion corresponds to the completely transparent portion of the mask. Then exposure, development and etching are performed to pattern the pixel electrode layer and a source/drain electrode metal layer to form the pixel electrode, the source/drain electrode, the data line, and the channel for the TFT, wherein the source/drain electrode is integrated with the data line.

The source/drain electrode metal layer deposited in this step can be a single layer film of Mo, MoW or Cr, and can also be a composite film of any combination of Mo, MoW, Cr.

Step D. A passivation layer is deposited on the substrate after step C for example by CVD process Then masking, exposing, developing and etching are performed to pattern the passivation layer to partially expose the gate lines and the data lines. Thereby, pads for connection are formed, and the passivation layer deposited on the semiconductor layer provides protection for the channel of the semiconductor layer. Up to this step, a complete TFT LCD array is manufactured with 3Mask technology.

Figure 4:
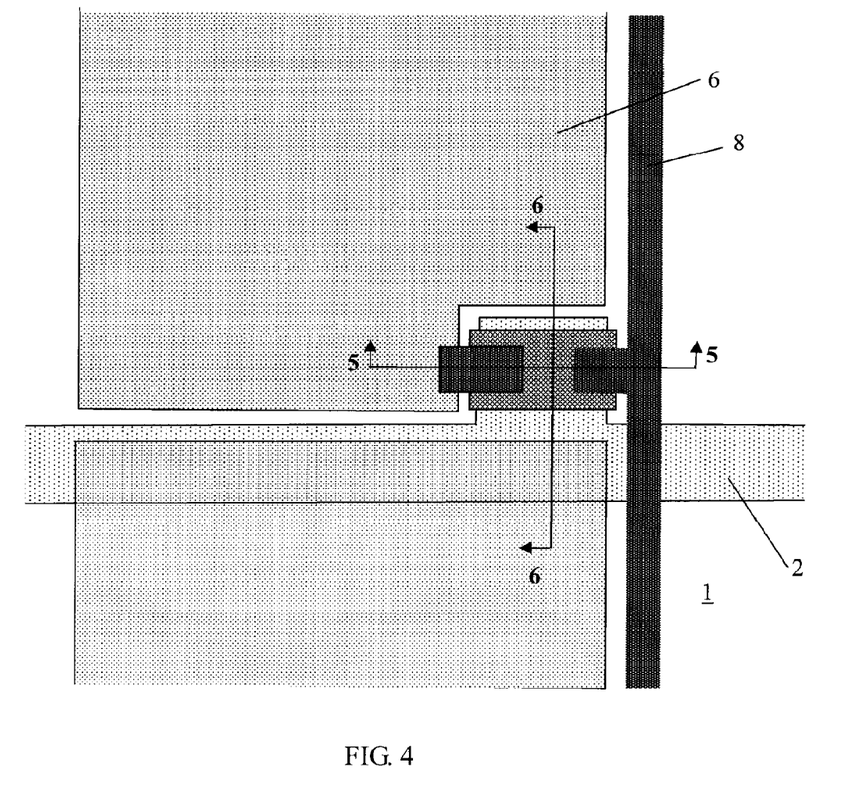
FIG. 4 is a plan view showing a typical pixel unit of a TFT LCD array substrate obtained according to the present invention.
Figure 5:
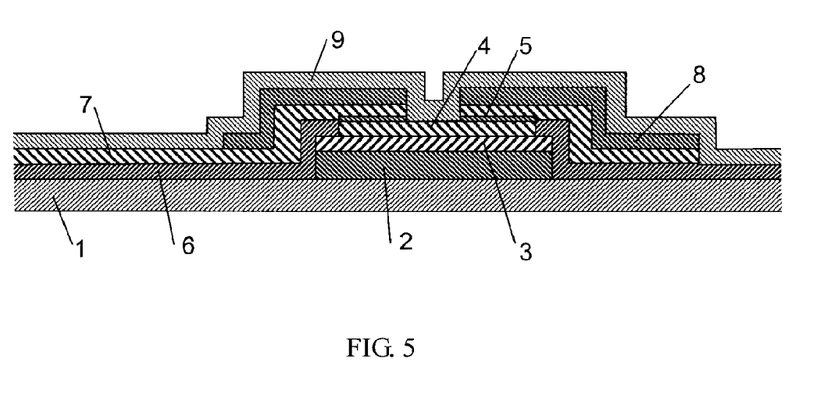
FIG. 5 is a cross-sectional view along the line A-A in FIG. 4.
Figure 6:
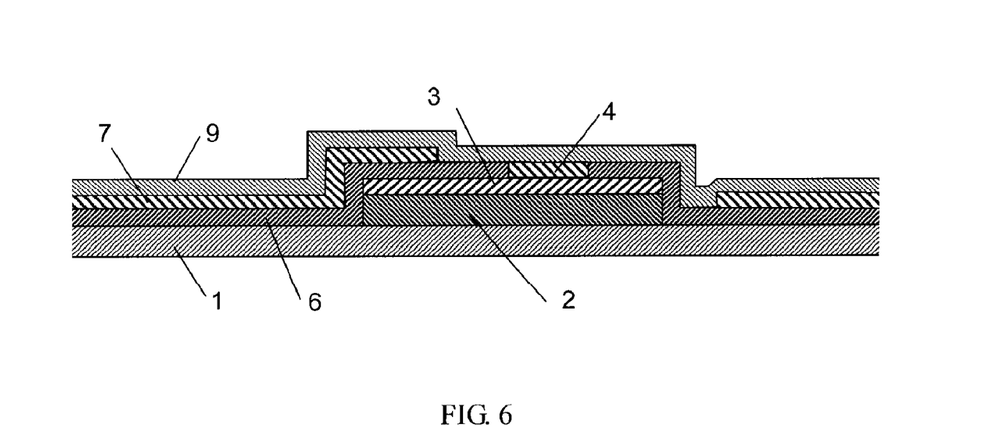
FIG. 6 is a cross-sectional view along the line B-B in FIG. 4.

FIG. 4 shows a TFT LCD array substrate obtained by the above-mentioned steps of the embodiment of the invention, FIG. 5 is a cross-sectional view along the line 5-5, and FIG. 6 is a cross-sectional view along the line 6-6.

The TFT LCD array substrate shown in these figures comprises the substrate 1, the gate line and the gate electrode 2, the gate insulating layer 3, the semiconductor layer 4, the ohmic contact layer 5. Herein, the laminate layer of the substrate 1, the gate electrode, and the gate insulating layer 3, excluding the portions on which the semiconductor layer 4 and the ohmic contact layer 5 of the TFT are formed, are covered by the isolation insulating dielectric layer 6, the pixel electrode 7 is formed on the isolation insulating dielectric layer 6 and the ohmic contact layer 5 of the TFT, the source/drain electrode is formed on the pixel electrode 7, and the data line is integrated with the source/drain electrode. In this preferred embodiment, the ohmic contact layer 5 can be a μc-Si layer. The gate line and the gate electrode 2 can be a single layer film of AlNd, Al, Cu, Mo, MoW or Cr, and can also be a composite film of any combination of AlNd, Al, Cu, Mo, MoW, Cr. The gate insulating layer 3 and the isolation insulating dielectric layer 6 can be a single layer film of SiNx, SiOx, or SiOxNy, or a composite film of any combination of SiNx, SiOx, SiOxNy. The source/drain electrode or the data line 8 can be a single layer film of Mo, MoW or Cr, and can also be a composite film of any combination of Mo, MoW, Cr.

Thereinafter, an example of the preferred embodiment according to the present invention will be described by reference to the accompanying drawings.

The manufacturing method of a TFT LCD array substrate according to the present invention includes following the steps.

Figure 7:
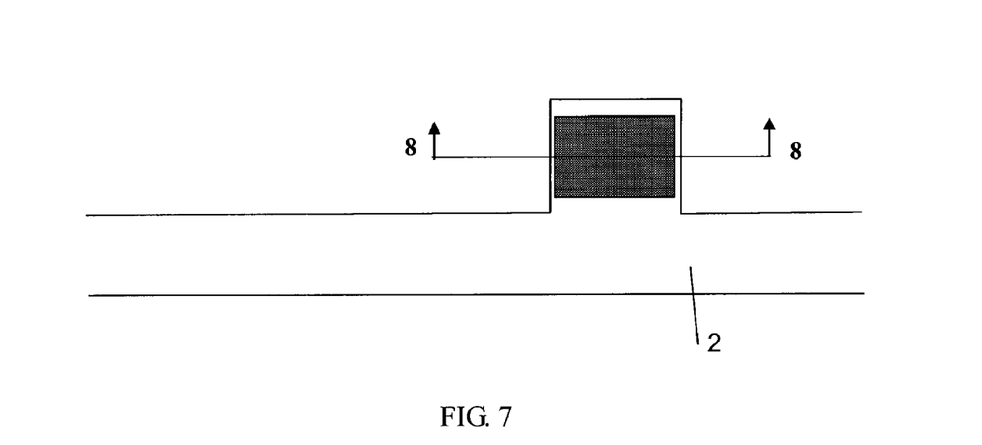
FIG. 7 is a plan view illustrating a stage after patterning with the first gray tone mask.
Figure 8:
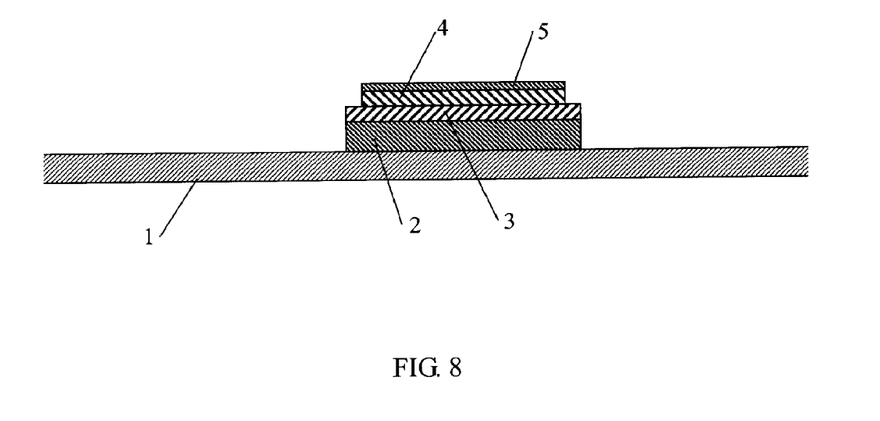
FIG. 8 is a cross-sectional view along the line C-C in FIG. 7.

Step A. A gate metal layer of Mo/AlNd/Mo (400 Å/4000 Å/600 Å) is deposited on the substrate 1 (made of glass or quartz) by magnetron sputtering. A gate insulating dielectric layer, a semiconductor material layer, and an ohmic contact material layer of SiNx/a-Si/μc-Si (5000 Å/100 Å/500 Å) are deposited in order on the substrate 1 by plasma enhanced chemical vapor deposition (PE-CVD) process. Photoresist 10 is applied to the surface of the resultant substrate 1, and masking and exposure with a first gray tone mask are performed, in which the portion of the photoresist on the substrate 1 corresponding to the gate line and the gate electrode 2 is partially exposed, the portion corresponding to a-Si (the semiconductor layer 4) and μc-Si (the ohmic contact layer 5) of the TFT is completely not exposed, and the portion corresponding to the remaining portion is completely exposed. After developing to form the photoresist pattern, reactive ion etching (RIE) is used to pattern the respective layers deposited above into the gate line and the gate electrode 2, the gate insulating layer 3, the TFT semiconductor layer 4, and ohmic contact layer 5, and the gate line and the gate electrode 2 is covered by the gate insulating layer 3, as shown in FIG. 7 in plan view and in FIG. 8 in cross-sectional view along line 8-8 of FIG. 7. In this step, the photoresist strip-off is not performed with respect to the photoresist 10 after etching.

Figure 9:
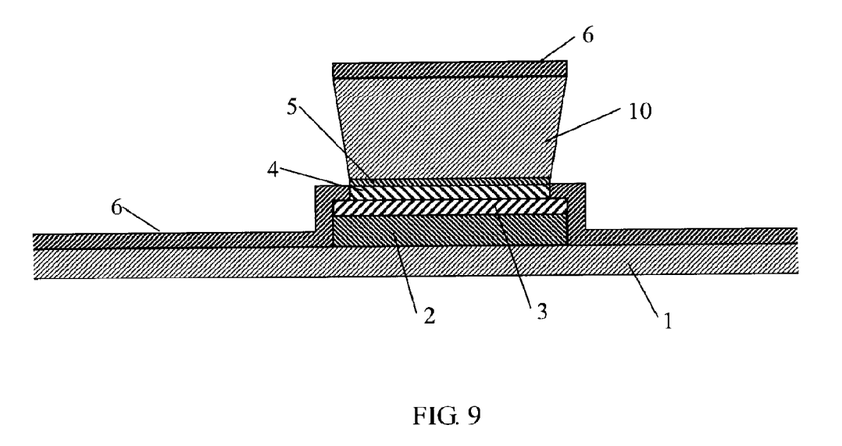
FIG. 9 is a plan view illustrating the isolation insulating dielectric layer before the photoresist strip-off according to the present invention.

Step B. An isolation insulating dielectric layer 6 of SiNx (500 Å) is deposited by PE-CVD process on the substrate after step A. The photoresist strip-off is performed to strip off the photoresist on the TFT semiconductor layer 4 and the ohmic contact layer 5 and the unwanted isolation insulating dielectric layer 6 deposited on the photoresist, so as to expose the ohmic contact layer 5, for the ohmic contact between the combination of the pixel electrode 7 and the source/drain electrode and the semiconductor layer 4 via the ohmic contact layer 5, as shown in FIG. 9.

Figure 10:
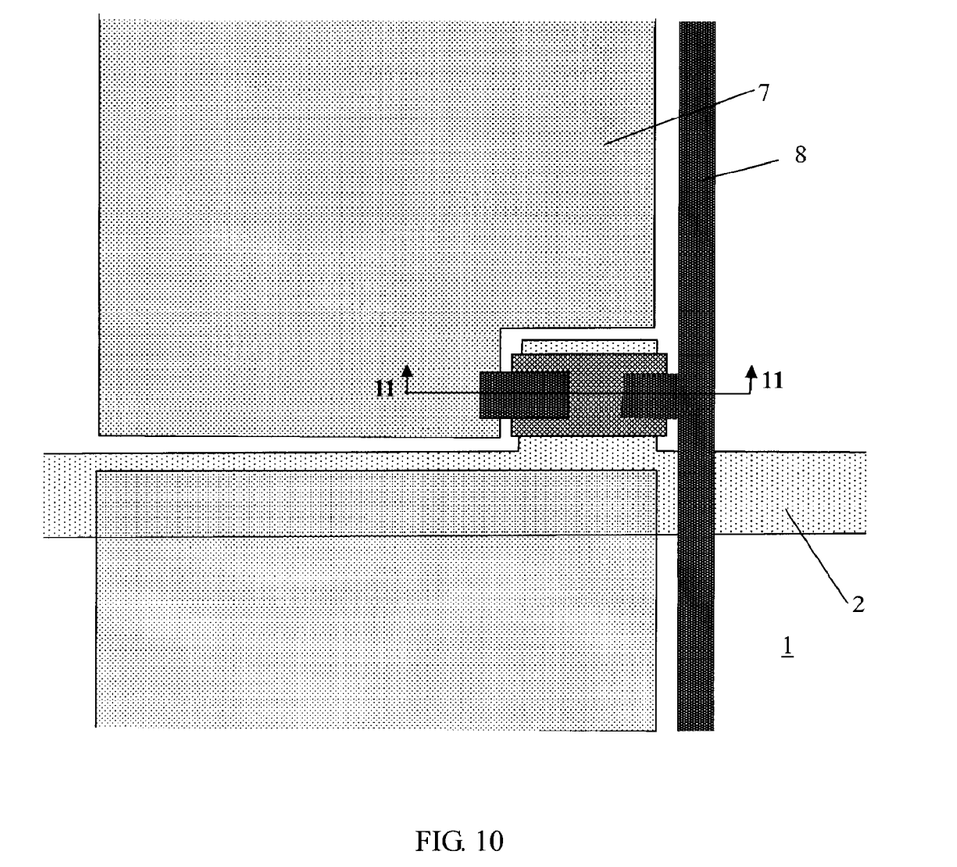
FIG. 10 is a plan view illustrating the substrate after patterning with the second gray tone mask.
Figure 11:
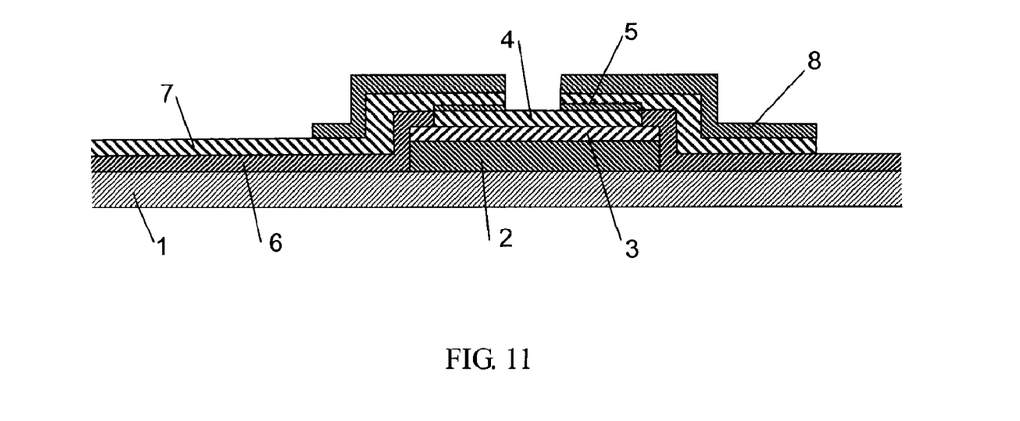
FIG. 11 is a cross-sectional view along the line D-D in FIG. 10.

Step C A pixel electrode layer of ITO (500 Å) and a source/drain electrode metal layer of Mo (Cr, W, or alloy thereof) (3000 Å) are deposited in sequence on the substrate after step B by sputtering in a same or different equipment. The photoresist is applied to the resultant substrate, and masking and exposure with a second gray tone mask are performed, in which the portion of the photoresist on the substrate 1 corresponding to the pixel electrode 7 is partially exposed, the portion of the photoresist corresponding to the source/drain electrode and the data line is not exposed, and the portion of the photoresist corresponding to the remaining portion of the substrate is completely exposed. Then, development and etching is performed to pattern the above pixel electrode layer and the source/drain electrode metal layer into the pixel electrode 7, the source/drain electrode and the data line 8, and the source/drain electrode is integrated with the data line 8, as shown in FIG. 10 in the plan view and in FIG. 11 in cross-sectional view along line 11 of FIG. 10.

Step D. A passivation layer 9 of SiNx (2000 Å) is deposited on the substrate after step C by PE-CVD process. The photoresist is applied to the resultant substrate, and masking for via hole (Via Hole Mask), exposure and etching are performed to form contact hole so that the gate lines and the data lines are partially expose to form the pads for connection to exterior and the passivation layer covering the semiconductor layer provides protection for the channel, thus completing the TFT LCD array, as shown in FIGS. 4, 5, and 6

The manufacturing method utilizing 3Mask process mentioned above provides a novel 3Mask method for manufacturing a TFT LCD array substrate, which is different from the existing 5Mask and 4Mask methods. With the inventive 3Mask process, a complete TFT array substrate can be obtained with less process steps, lower production cost and higher yield, and moreover the yield and utilization ratio of the sputter equipment can also be improved.

The preferred embodiment only presents a specific solution for realizing the present invention, but the device configuration and the process conditions in this embodiment can be varied.

For example, during each of the masking steps in the present invention, a positive or negative photoresist can be used; the structure and thickness of individual layers can be changed as desired; other methods of physical vapor deposition (PVD) such as evaporation, electron beam evaporation, plasma spray and the like, and chemical deposition methods such as atmospheric pressure CVD and the like can be employed; and dry etching such as plasma etching, reactive ion etching (RIE) and the like can be used. The specific process conditions of these methods can be varied depending on the specific requirements in manufacturing the LCD. Furthermore, in addition to the µc-Si, the ohmic contact layer can also be doped (e.g. phosphor-doped) µc-Si or other suitable materials.

However, these variations should do not depart from the spirit and scope of forming the gate electrode and the TFT semiconductor layer with a gray tone mask during the same masking, and depositing successively the pixel electrode layer and the source/drain electrode layer and forming the pixel electrode and source/drain electrode with a same gray tone mask during the same masking.

What is claimed is:

1. A method of manufacturing a thin film resistor liquid crystal display (TFT LCD) array substrate, comprising the steps of:
   step A of depositing a gate metal layer, a gate insulating dielectric layer, a semiconductor material layer and an ohmic contact material layer in order on a substrate, and patterning thereof using a first gray tone mask and photoresist into gate lines and gate electrodes, gate insulating layers, and semiconductor layers and ohmic contact layers, respectively, wherein the photoresist disposed on the ohmic contact layers is not stripped off;
   step B of depositing an isolation insulating dielectric layer on the substrate after step A, and then stripping off the photoresist to thereby remove the isolation insulating dielectric layer disposed on the ohmic contact layers;
   step C of depositing in sequence a pixel electrode layer and a source/drain electrode metal layer on the substrate after step B, and then patterning thereof using a second gray tone mask and photoresist into pixel electrodes, source/drain electrodes and data lines, wherein each of the ohmic contact layers is partially removed to partially expose the semiconductor layer thereunder; and
   step D of depositing a passivation layer on the substrate after step C which at least covers the exposed semiconductor layers.

2. The manufacturing method according to claim 1, wherein the ohmic contact material layer deposited in step A is made of a µc-Si.

3. The manufacturing method according to claim 1, wherein when patterning using the first gray tone mask in step A, a portion of the substrate where the gate lines and the gate electrodes will be formed corresponds to a partially transparent portion of the mask, another portion of the substrate where the gate electrodes, the semiconductor layers and the ohmic contact layers will be formed corresponds to an opaque portion of the mask, and a remaining portion of the substrate corresponds to a completely transparent portion of the mask.

4. The manufacturing method according to claim 1, wherein when patterning using the second gray tone mask in step C, a portion of the substrate where the pixel electrodes will be formed corresponds to a partially transparent portion of the mask, another portion of the substrate where the source/drain electrodes and the data lines will be formed corresponds to an opaque portion of the mask, and a remaining portion of the substrate corresponds to a completely transparent portion of the mask.

5. The manufacturing method according to claim 1, wherein the pixel electrode layer and the source/drain electrode metal layer are deposited successively using the same equipment in step C.

6. The manufacturing method according to claim 1, wherein in the step D after depositing the passivation layer on the substrate, the passivation layer is then patterned to partially expose the gate lines and the data lines, thereby forming pads.

7. A method of manufacturing a TFT LCD array substrate, comprising the steps of:
   step A of depositing a gate metal layer, a gate insulating dielectric layer, a semiconductor material layer and an ohmic contact material layer in order on a substrate, and patterning thereof using a first gray tone mask and photoresist into gate lines and gate electrodes, gate insulating layers, and semiconductor layers and ohmic contact layers, respectively, wherein the photoresist disposed on the ohmic contact layers is not stripped off;
   step B of depositing an isolation insulating dielectric layer on the substrate after step A, and then stripping off the photoresist to thereby remove the isolation insulating dielectric layer disposed on the ohmic contact layers;
   step C of depositing a first pixel electrode layer and a second source/drain electrode metal layer over the first pixel electrode layer on the substrate after step B, and then patterning thereof using a second gray tone mask and photoresist into pixel electrodes, source/drain electrodes and data lines, wherein each of the ohmic contact layers is partially removed to partially expose the semiconductor layer thereunder; and
   step D of depositing a passivation layer on the substrate after step C which at least covers the exposed semiconductor layers.

8. The manufacturing method according to claim 7, wherein the ohmic contact material layer deposited in step A is made of a µc-Si.

9. The manufacturing method according to claim 7, wherein when patterning using the first gray tone mask in step A, a portion of the substrate where the gate lines and the gate electrodes will be formed corresponds to a partially transparent portion of the mask, another portion of the substrate where the gate electrodes, the semiconductor layers and the ohmic contact layers will be formed corresponds to an opaque portion of the mask, and a remaining portion of the substrate corresponds to a completely transparent portion of the mask.

10. The manufacturing method according to claim 7, wherein when patterning using the second gray tone mask in step C, a portion of the substrate where the pixel electrodes will be formed corresponds to a partially transparent portion of the mask, another portion of the substrate where the source/drain electrodes and the data lines will be formed corresponds to an opaque portion of the mask, and a remaining portion of the substrate corresponds to a completely transparent portion of the mask.

11. The manufacturing method according to claim 7, wherein the first pixel electrode layer and the second source/drain electrode metal layer are deposited successively using the same equipment in step C.

12. The manufacturing method according to claim 7, wherein in the step D after depositing the passivation layer on the substrate, the passivation layer is then patterned to partially expose the gate lines and the data lines, thereby forming pads.

* * * * *